US 10,097,168 B2

(12) United States Patent
Guthaus et al.

(10) Patent No.: US 10,097,168 B2
(45) Date of Patent: Oct. 9, 2018

(54) CURRENT-MODE CLOCK DISTRIBUTION

(71) Applicant: The Regents of the University of California, Oakland, CA (US)

(72) Inventors: Matthew Guthaus, Santa Cruz, CA (US); Riadul Islam, Santa Cruz, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/701,133

(22) Filed: Sep. 11, 2017

(65) Prior Publication Data

US 2018/0076799 A1 Mar. 15, 2018

Related U.S. Application Data

(63) Continuation of application No. 15/115,382, filed as application No. PCT/US2015/013572 on Jan. 29, 2015, now Pat. No. 9,787,293.

(60) Provisional application No. 61/933,204, filed on Jan. 29, 2014.

(51) Int. Cl.
H03K 3/356 (2006.01)
G05F 3/26 (2006.01)
G06F 1/10 (2006.01)

(52) U.S. Cl.
CPC ....... H03K 3/356104 (2013.01); G05F 3/262 (2013.01); G06F 1/10 (2013.01)

(58) Field of Classification Search
None
See application file for complete search history.

(56) References Cited

U.S. PATENT DOCUMENTS

| 4,719,375 | A | 1/1988 | Martin |
| 5,109,168 | A | 4/1992 | Rusu |
| 5,889,431 | A | 3/1999 | Csanky |
| 6,768,655 | B1 | 7/2004 | Yang et al. |
| 6,897,699 | B1 | 5/2005 | Nguyen et al. |
| 7,187,222 | B2 | 3/2007 | Meltzer et al. |
| 7,705,661 | B2 | 4/2010 | Li et al. |
| 8,289,045 | B2 | 10/2012 | Momtaz |
| 8,319,487 | B2 | 11/2012 | Michishita et al. |
| 8,629,715 | B1 | 1/2014 | Gramegna et al. |
| 8,773,191 | B2* | 7/2014 | Park .......................... H03K 5/08 327/309 |
| 2010/0182045 | A1 | 7/2010 | Momtaz |

(Continued)

FOREIGN PATENT DOCUMENTS

EP 0677802 A1 10/1995

OTHER PUBLICATIONS

Yamashima et al., "An MOS current mode logic (MCML) circuit for low-power sub-GHz processors," IEICE Transactions On Electronics, E75-C(10): pp. 1181-1187 (1992).

(Continued)

Primary Examiner — Lincoln Donovan
Assistant Examiner — Khareem E Almo
(74) Attorney, Agent, or Firm — Venable LLP; Henry J. Daley; Ryan T. Ward

(57) ABSTRACT

Current-mode signaling for a one-to-many clock signal distribution providing significantly less dynamic power use and improved noise immunity compared to traditional VM signaling schemes.

18 Claims, 5 Drawing Sheets

(56) References Cited

U.S. PATENT DOCUMENTS

| | | | |
|---|---|---|---|
| 2010/0231312 A1* | 9/2010 | Denier | H03K 3/012 |
| | | | 331/111 |
| 2013/0154603 A1* | 6/2013 | Cerutti | G05F 3/02 |
| | | | 323/312 |
| 2013/0187799 A1 | 7/2013 | Chang | |
| 2013/0249612 A1 | 9/2013 | Zerbe et al. | |
| 2016/0267988 A1* | 9/2016 | Ogawa | G11C 16/10 |
| 2016/0308512 A1* | 10/2016 | Ruotsalainen | H03K 3/012 |
| 2017/0012614 A1* | 1/2017 | Guthaus | G06F 1/10 |

OTHER PUBLICATIONS

Yuan et al., "High-speed CMOS Circuit Technique," IEEE Journal of Solid State Circuits, vol. 21, No. 1, pp. 62-70 (Feb. 1989).

Katoch et al., "High Speed Current-mode Signaling Circuits for On-Chip Interconnects," IEEE, pp. 4138-4141 (2005).

Dave et al., "A Variation Tolerant Current-Mode Signaling Scheme for On-Chip Interconnects," IEEE TVLSI, vol. 21, No. 2, pp. 342-353 (Feb. 2013).

\* cited by examiner

CURRENT-MODE CLOCK DISTRIBUTION

RELATION TO OTHER APPLICATIONS

This application is a continuation of U.S. patent application Ser. No. 15/115,382, filed Jul. 29, 2016, which is a U.S. National Stage Application under 35 U.S.C. § 371 of PCT/US2015/13572, filed Jan. 29, 2015, and claims the benefit of U.S. Provisional Application No. 61/933,204, filed Jan. 29, 2014, the entire content of which is hereby incorporated by reference.

GOVERNMENT SUPPORT

This invention was made with Government support under CCG-1053838 SC#20101352, awarded by the National Science Foundation. The government has certain rights in the invention.

FIELD OF THE INVENTION

The presently disclosed subject matter is directed towards clock distribution networks. More particularly the disclosed subject matter is directed to current-mode clock distribution networks and to their use in integrated circuits.

BACKGROUND OF THE INVENTION

The on-going demand for high performance portable electronic systems having long battery lifetimes has driven the need for ever higher performance at ever lower operating power. Those demands often conflict: higher performance tends to require higher power while long battery lifetimes tend to be associated with lower performance.

A direct approach to achieving higher performance and longer battery lifetimes is simply to use longer life batteries. This creates the problem that for a given battery chemistry greater battery energy storage requires larger and heavier batteries. Eventually both battery size and weight increase to the point that they become unacceptable in a given system.

Another approach to achieving higher performance and longer battery lifetimes is to incorporate effective designs. In fact effective designs are critical in many synchronous Application Specific Integrated Circuits (ASICs) and System-on-Chips (SOCs) devices.

Since almost all modern electronic system designs are clocked one area that is well suited for effective designs are clock distribution networks. In a clocked system gate operations are synchronized by clock signals. So long as the gates can keep up with the clock the higher the clock rate the faster the performance. Unfortunately high speed clocking consumes a great deal of power. In fact, the on-chip clock distribution network (hereinafter "CDN" for convenience) of modern very large scale integrated circuit (hereinafter "VLSI circuits" for convenience) often consumes more than 35% of the total chip power and can occasionally require as much as 70%.

Prior art VLSI circuit designs tended to focus on reducing the lengths of interconnects such as global buses and CDNs by increasing device density. This reduced path lengths, which reduced resistances which reduced power consumption. But since higher densities enabled increased clock speeds power consumption also increased.

In prior art VLSI circuit CDNs are almost always voltage-mode operated. That is, a clock drove clocked devices using voltage levels. In CMOS technology the applied logic levels are ideally zero and $V_{dd}$ (usually the applied power supply voltage) but in practice slightly different logic levels induce switching. This "voltage mode" switching is currently and for decades has been the de facto standard in logic families.

While voltage mode switching has been an enabling technology in modern electronics its limitations are becoming apparent. Switching logic level inputs invariably requires driving a capacitance to either charge or discharge. To avoid noise problems and to maintain reliable device switching the voltage difference between a HIGH logic level (ideally $V_{dd}$) and a LOW logic level (ideally zero) can only be minimized so much. Thus a driven capacitance must be charged or discharged over a rather large voltage step. The result is that both the achievable performance and power reduction in voltage mode clocked device designs are limited.

However, prior to and in early CMOS technologies current-mode (hereinafter "CM") logic was a viable alternative approach used for high-speed signaling. Reference, for example, M, Yamashina and H, Yamada, "An MOS current mode logic (MCML) circuit for low-power sub-GHz processors." IEICE Transactions On Electronics, E75-C(10): 1181-1187. 1992. That publication is hereby incorporated by reference for all purposes to the full extent allowable by law.

CM logic, sometimes referred to as source-coupled logic has been successfully used for interfacing with fiber optical systems and other high-speed data devices. CM logic circuits can be made very fast because they operate using a lower voltage swing than comparable voltage mode logic circuits. This makes CM logic switching interesting when confronted with the power and variability problems of voltage mode switching.

FIG. 1 illustrates a prior art CM logic circuit 100. That CM logic circuit 100 incorporates a voltage mode input transmitter (Tx) 102 that transmits a current having a minimal voltage swing onto an interconnect 104 such as a transmission line. A transimpedance amp receiver (Rx) 106 converts the received current into a full-swing output voltage using a current-to-voltage converter. The CM logic circuit 100 reduces delays over voltage mode schemes at the cost of larger signal skews that result from small shifts in the receiver (Rx) 106 voltage swings relative to a common-mode reference voltage. Other researchers have implemented somewhat different CM logic schemes. However, all such schemes have problems such as rise and fall-time mismatches and large static and dynamic power consumptions.

However, in CM logic switching the required static power is often significantly less than the dynamic power required in voltage mode logic switching. In addition, device latency can be significantly improved using CM logic switching. CM logic switching may also improve reliability since they are less susceptible to single-event transient spikes and have reduced heat generation.

Therefore, CM logic switching in clock distribution networks would be beneficial. Preferably, such a CM logic clock distribution network would implement current mode clocking devices. CM operated flip-flops that are suitable for incorporation at the chip level for clock distribution would be highly advantageous. VLSI devices that use CM flip-flop clocking devices in CDNs would be particularly valuable. High fan out symmetric CM distribution trees having multiple CM flip-flops would be particularly useful.

BRIEF SUMMARY OF THE INVENTION

The present invention encompasses current-mode signaling for a one-to-many clock signal distribution providing significantly less dynamic power use and improved noise immunity compared to traditional VM signaling schemes.

The present invention encompasses current-mode (CM) logic switched clock distribution networks (CDNs). Those CDNs implement CM clocking devices, specifically CM logic operated flip-flops. Such CM logic operated flip-flops can be incorporated into CDNs at the chip level. Such CNDs are particularly beneficial in VLSI devices that implement CM operated flip-flops for clock distribution in high fan out symmetric distribution trees. The present invention includes CM signaling for one-to-many clock signal distribution.

One device that is in accord with the present invention is a current mode flip-flop having a first current mirror for receiving a voltage reference and for producing a first reference current in response to the voltage reference, a second current mirror for producing a second reference current, and a current input for modifying the second reference current. The current mode flip-flop also includes a current comparator for producing a difference current between the first reference current and the modified second reference current, inverting amplifiers for converting the difference current into a logic level voltage, a pulse shaper receiving the logic level voltage and for applying a delayed version to the current comparator to thereby form a clock signal having a pulse duration, a register stage for receiving a data signal and the clock signal, and a storage cell for storing the data when the clock signal occurs.

In practice the voltage reference is set by a current reference which may be externally applied. The current mode flip flop is beneficially fabricated using CMOS technology such as 45 nm CMOS technology. The current mode flip-flop may be part of an H-tree clock distribution network, in particular a current balanced H-tree clock distribution network.

Another device that is in accord with the present invention is a very large scale integrated circuit having a voltage mode clock to current mode clock converter that receives a voltage mode clock and outputs a current mode clock to an H-Tree clock distribution network having at least a first current mode flip-flop and a second current mode flip-flop via an interconnect. The H-Tree clock distribution network evenly distributes the current mode clock to the first current mode flip-flop and to the second current mode flip-flop. The converter may include a NAND gate having an input receiving the voltage mode clock, a NOR gate having an input receiving the voltage mode clock, and a delay element receiving the voltage mode clock and outputting a delayed voltage mode clock to the NAND gate and to the NOR gate. If so, the very large scale integrated circuit can have a first transistor that receives the output of the NAND gate, with the first transistor being connected to $V_{dd}$ and to the interconnect. Then, the very large scale integrated circuit may include a second transistor that receives the output of the NOR gate, the second transistor being connected to ground and to the interconnect.

The very large scale integrated circuit first current mode flip-flop preferably includes a first current mirror that receives a voltage reference and produces a first reference current in response to the voltage reference, and a second current mirror for producing a second reference current. The first current mode flip-flop may include a current input for modifying the second reference current, a current comparator for producing a difference current between the first reference current and the modified second reference current, inverting amplifiers for converting the difference current into a logic level voltage, a pulse shaper receiving the logic level voltage and for applying a delayed version to the current comparator to thereby form a clock signal having a pulse duration. Furthermore, a register stage receives a data signal and the clock signal while a storage cell stores the data signal when the clock signal occurs.

In practice the voltage reference may be produced by a current reference or it may be externally applied. The first current mirror may be fabricated using CMOS technology such as 45 nm CMOS technology. The first current mode flip-flop may be part of an H-tree clock distribution network such as a balanced H-tree clock distribution network.

BRIEF DESCRIPTION OF THE DRAWINGS

The advantages and features of the present invention will become better understood with reference to the following detailed description and claims when taken in conjunction with the accompanying drawings, in which like elements are identified with like symbols, and in which:

DETAILED DESCRIPTION OF THE INVENTION

The presently disclosed subject matter now will be described more fully hereinafter with reference to the accompanying drawings in which various embodiments are shown. However, it should be understood that this invention may take many different forms and thus the specifically illustrated embodiments should not be construed as limiting the present invention.

All publications mentioned herein are incorporated by reference for all purposes to the extent allowable by law. In addition, in the figures like numbers refer to like elements throughout. The terms "a" and "an" as used herein do not denote a limitation of quantity, but rather denote the presence of at least one of the elements.

All known prior art CM logic systems generate a CM clock signal, transmit that CM clock, perform a current-to-voltage conversion on the received CM clock, buffer the resulting voltage mode clock signal, and then distribute the voltage mode clock signal to various circuit devices. The result was a full voltage swing clocking network that used a significant chip area to implement the required buffer and a large dynamic power to drive clock line capacitances. In direct contrast the principles of the present invention enable CM flip-flops that directly receive a current mode clock signal. This reduces the overall power consumption and required chip area. The present invention can find use in synchronously clocked VLSI chips, preferably implemented on a silicon die. The present invention also can be used in other types of devices and systems.

Figure 1:
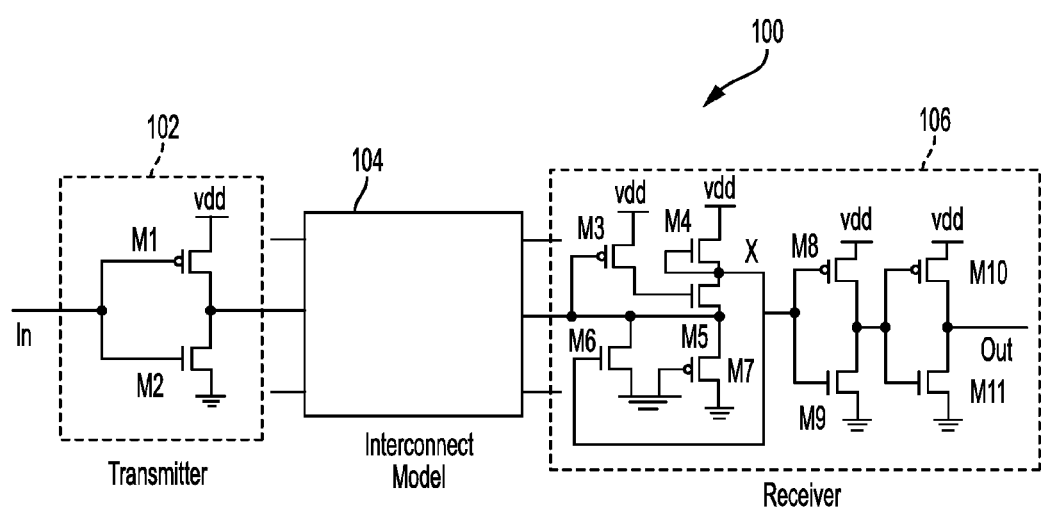
FIG. 1 illustrates a prior art CM logic circuit 100.
Figure 2:
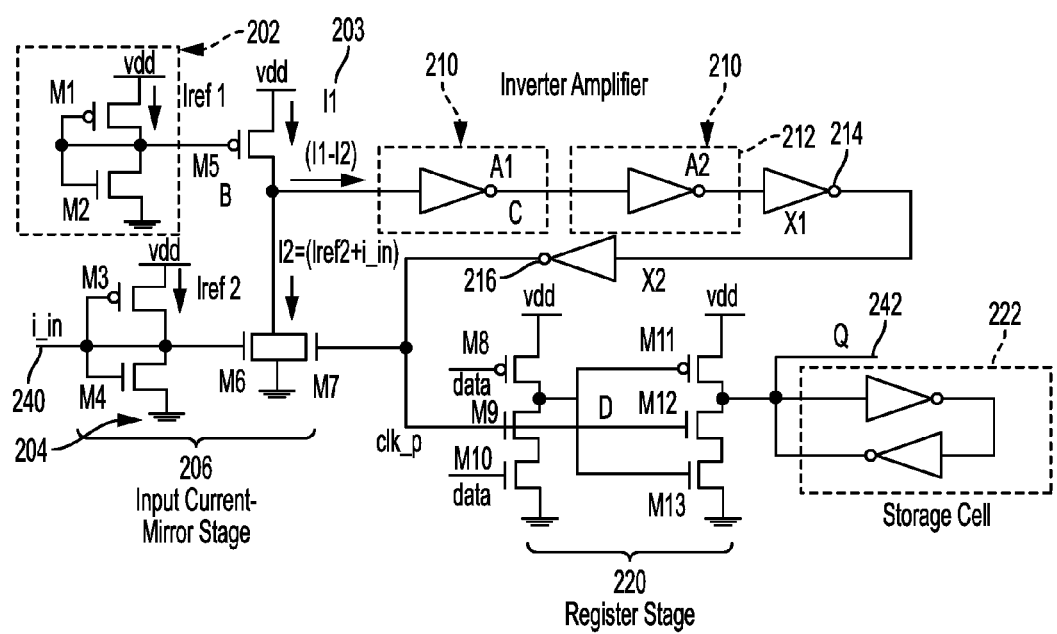
FIG. 2 illustrates a CMPFF 200 that is in accord with the present invention.
Figure 3:
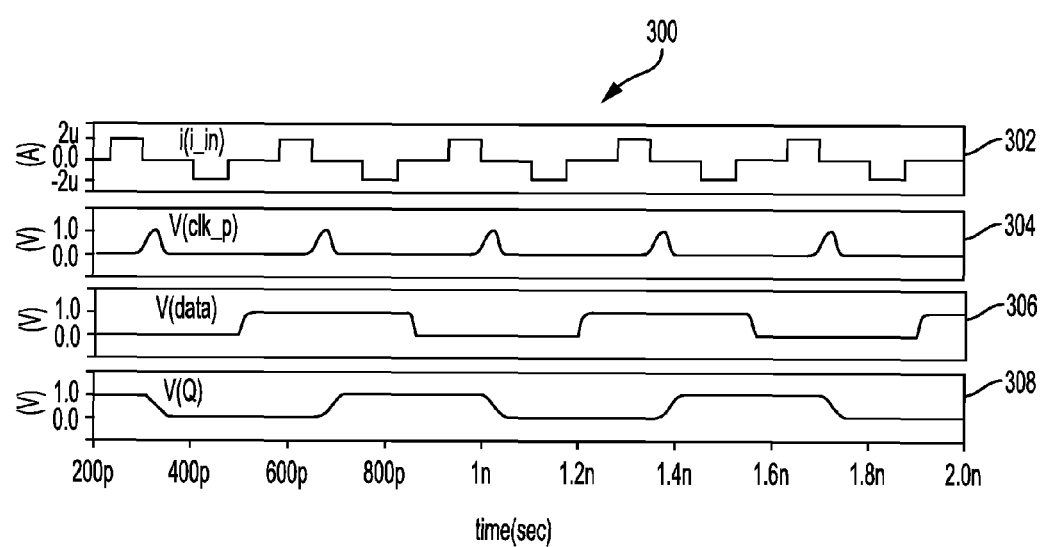
FIG. 3 presents a timing diagram simulation 300 of the CMPFF 200.

FIG. 2 illustrates a CM logic pulsed flip-flop 200 (hereinafter usually referred to as a "CMPFF 200" for convenience). FIG. 3 present simulation results of the CMPFF 200. The CMPFF 200 includes a reference voltage generator 202, a reference mirror 203, an input current receiver 204, a current-comparator stage 206, a pulse forming stage (discussed in more detail subsequently) having a pair of inverter amplifiers 210 and 212, pulse formers 214 and 216, a register stage 220 and a static storage cell 222. In operation the current-comparator stage 206 compares an input push-pull current $I_{in}$ on a clock (line 240) with a reference current I1 and conditionally amplifies the clock current $I_{in}$ to a full-swing voltage pulse that latches data into the register stage 220, with the data being stored in the static storage cell 222 and output on a line 242. The CMPFF 200 is in stark contrast to previous CM logic schemes which utilized large and expensive Rx circuits and buffers to drive storage flip flops.

By switching on input push-pull currents $I_{in}$ the CMPFF 200 enables use of a relatively simple transmitter Tx circuit (discussed in more detail subsequently) while maintaining a relatively constant bias voltage on interconnects. The CMPFF 200 is designed to be sensitive to the unidirectional push current to provide the positive edge trigger needed for operation. This approach lends itself to the use of a complementary current comparator Tx that uses a pull current to produce negative clock edges.

Still referring to FIG. 2, the reference voltage stage 202 includes a pair of MOS transistors (M1-M2) that creates a first reference current ($I_{ref}1$). The first reference current ($I_{ref}1$) is mirrored by reference mirror 203 M5 to produce a current IL Similarly, the input current receiver 204 includes a reference voltage generator pair M3-M4 that creates a flip-flop reference current ($I_{ref}2$). That flip-flop reference current ($I_{ref}2$) is combined with input current $I_{in}$. The resulting current combination is mirrored by M6 of the current-comparator stage 206 to generate a modified current I2. The difference between the first reference current $I_{ref}1$ and the modified current I2 is applied on line B.

In practical applications the reference mirror 203 M5 voltage may use a global reference in place of the reference voltage stage 202. That can increase overall system robustness by reducing transistor mismatches between flip-flops while also saving two transistors per CMPFF 200. Saving those two transistors reduces required static power with a negligible performance penalty. However, the reference mirror 203 M5 voltage would require global distribution and consume metal routing resources. Thus the preferred embodiment is shown in FIG. 2.

Still referring to FIG. 2, the difference in the mirrored currents I1 and I2 is compared using an inverting amp 210 whose input is at a node B. The output of the inverting amp 210 is applies to a CMOS logic level by inverting amp 212. Then inverter pair 214 and 216 generates the required voltage pulse duration using feedback that is applied to M7 of the current-comparator stage 206.

The feedback applied to M7 quickly pulls node B down. This facilitates generating small voltage pulses having less than 50% duty cycle and results in fewer transistors in the register stage (see below).

The register stage 220 is similar to a single-phase register as used in J. J. Yuan and C. Svensson, "High-speed CMOS Circuit Technique," Solid-State Circuits, IEEE Journal of, 24(1):62-70, but requires fewer transistors. It also has a reduced clock load. The current-generated voltage pulse (clk_p) triggers storing data in the static storage cell 222.

In FIG. 2, the size of M7 of the current-comparator stage 206 is critical to the voltage pulse. Preferably it is a minimum sized NMOS transistor having a unity aspect ratio. The width of the generated voltage pulse (clk_p) is also sensitive to the width and amplitude of input current $I_{in}$. The amplitude of $I_{in}$ strongly affects flip flop performance by changing the operating point of M6. This may add extra delays to the generated clk_p. To achieve minimum C-to-Q delay, the input current should have ±2.3 uA amplitude and be about 70 ps wide.

FIG. 3 illustrates waveforms 300 of the CMPFF 200. The input current $I_{in}$ is shown on line 302. As shown that input current $I_{in}$ involves pulses centered about 0 amperes. The resulting clock V clk_p at the output of inverter 216 is shown on line 304. Data to be clocked in is shown on line 306. Finally, the output voltage $V_Q$ on line 242 is shown on line 308.

Figure 4:
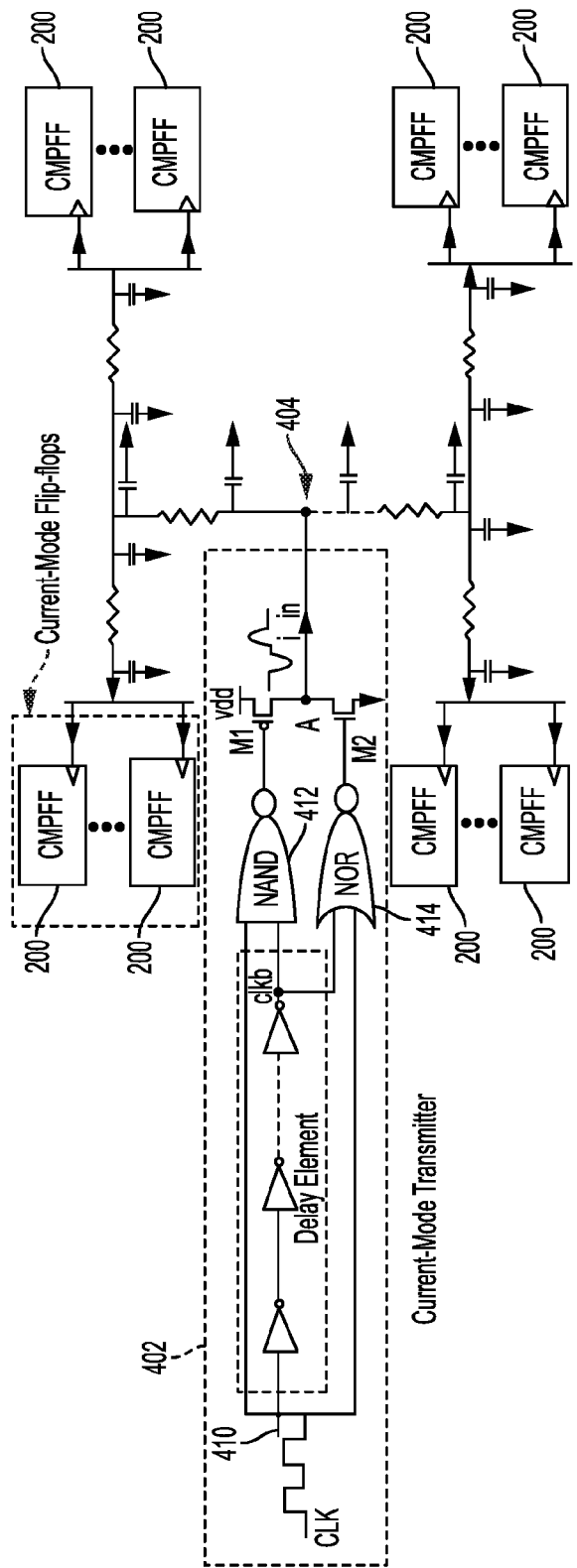
FIG. 4 is a schematic depiction of a CM clocked network 400 that is in accord with the present invention and which incorporates a voltage-mode to CM clock driver.

To integrate CMPFF 200 into a VLSI a reliable transmitter Tx that can provide the required push-pull current into a clocked network of CMPFFs 200 while distributing the required current to each CMPFF 200 is needed. FIG. 4 illustrates a VLSI device 400 having such transmitter Tx 402. Also shown is a symmetric H-tree network 404 having a balanced set of CMPFFs 200.

The transmitter Tx 402 receives a traditional voltage CLK from a PLL/clock divider on line 410. The transmitter Tx 402 then supplies a pulsed current to the symmetric H-tree network 404 which has equal impedances in each branch. The symmetric H-tree network 404 distributes current evenly to each CMPFF 200 on each leaf node.

The transmitter Tx 402 of FIG. 4 is similar to previous Tx circuits used in A. Katoch, H. Veendrick, and E, Seevinck, "High speed current-mode signaling circuits for on-chip interconnects," in ISCAS, pages 4138-4141, May 2005 and in M. Dave, M. Jain, S. Baghini, and D. Sharma, "A variation tolerant current-mode signaling scheme for on-chip interconnects, IEEE TVLS1, PP(99):1 12, January 2012.

However, the transmitter Tx 402 uses a NAND-NOR design. The NAND gate 412 uses the CLK signal and a delayed inverted CLK signal, clkb, as inputs to generate a small negative pulse to briefly turn on M1. Hence, the PMOS transistor briefly sources charge from the supply while the NMOS is off. Similarly, the NOR gate 414 utilizes the negative edge of the CLK and clkb signals to briefly turn on M2. Hence, the NMOS transistor briefly sinks current while the M1 is off. The non-overlapping input signals from the NAND-NOR gates 412, 414 beneficially prevent short circuit current from the transmitter Tx 402.

The transmitter Tx 402 MI and M2 device sizes are preferably adjusted to supply/sink charge into the symmetric H-tree network 404 CDN. The root wires of the symmetric H-tree network 404 carry currents that are distributed to all branches. Thus the sizing of the symmetric H-tree network 404 wires is critical for performance and reliability. If the resistance of the wires are too high, the current waveform magnitude and period will be distorted and negatively affect performance of the CMPFF 200. The wire width must also consider electromigration effects while carrying the total current to drive all the CMPFF 200 with the required current amplitude and duration.

Figure 5:
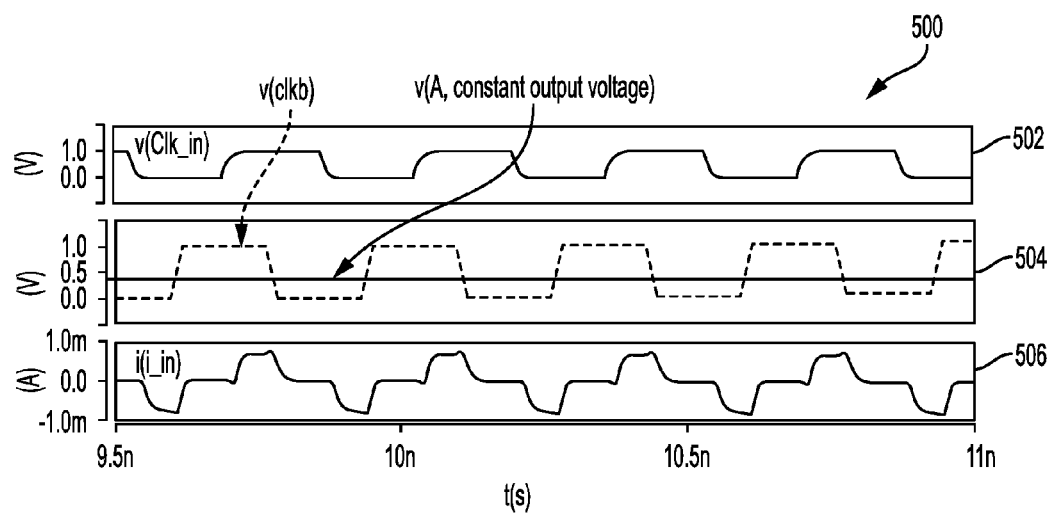
FIG. 5 presents a timing diagram simulation 500 of the CM clocked network 400.

FIG. 5 provides simulated waveforms 500 of the VLSI device 400 that help illustrate how the internal current-to-voltage pulse generation (clk_p) triggers input data capture. The CLK input on line 410 is shown on line 502. The resulting voltage of the delayed clkb which is applied to NAND-NOR gates 412, 414 is shown on line 504. The resulting current clock applied to the CMPFF 200 is shown on line 506. The simulation of FIG. 5 confirms that a voltage mode input is converted to a constant CDN voltage and a representative push-pull current results at each CMPFF 200. In practice the CMPFFs 200 consumes about 2.9% less silicon area than traditional voltage mode flip flops.

A practical layout the VLSI device 400 would use 45 nm CMOS technology with each CMPFF 200 being compatible with a standard cell library height of 12 horizontal M2 tracks. The symmetric H-tree network 404 CDN would span about 1.2 mm×1.2 mm. Typical clock frequencies would be between 1.5 and 5 GHz using a 1 V supply and have around 20 ps slew.

It is to be understood that while the figures and the above description illustrates the present invention, they are exemplary only. They are not intended to be exhaustive or to limit the invention to the precise forms disclosed, and obviously many modifications and variations are possible in light of the above teaching. Others who are skilled in the applicable arts will recognize numerous modifications and adaptations of the illustrated embodiments that remain within the principles of the present invention. Therefore, the present invention is to be limited only by the appended claims.

The invention claimed is:

1. A current mode flip-flop, comprising:
 a first current mirror for receiving a voltage reference and for producing a first reference current in response to said voltage reference;
 a second current mirror for producing a second reference current;
 a current input for modifying said second reference current;
 a current comparator for producing a difference current between said first reference current and said modified second reference current;
 an inverting amplifier for converting said difference current into a logic level voltage;
 a pulse shaper receiving said logic level voltage and for applying a delayed version to said current comparator to thereby form a clock signal having a pulse duration;
 a register stage for receiving a data signal and said clock signal; and
 a storage cell for storing data when said clock signal occurs.

2. The current mode flip flop of claim 1, wherein said voltage reference is produced by a current reference.

3. The current mode flip flop of claim 1, wherein said voltage reference is externally applied.

4. The current mode flip flop of claim 1, wherein said first current mirror is fabricated using CMOS technology.

5. The current mode flip flop of claim 4, wherein said CMOS technology is 45 nm CMOS technology.

6. The current mode flip-flop of claim 1, wherein said current mode flip-flop is part of an H-tree clock distribution network.

7. The current mode flip-flop of claim 6, wherein said current mode flip-flop is part of a current balanced H-tree clock distribution network.

8. A very large scale integrated circuit, comprising:
 a voltage mode clock to current mode clock converter receiving a voltage mode clock and outputting a current mode clock;
 an H-Tree clock distribution network having at least a first current mode flip-flop and a second current mode flip-flop; and
 an interconnect connecting said current mode clock to said H-Tree clock distribution network;
 wherein said H-Tree clock distribution network evenly distributes said current mode clock to said first current mode flip-flop and to said second current mode flip-flop.

9. The very large scale integrated circuit of claim 8, wherein said converter includes a NAND gate having an input receiving said voltage mode clock, a NOR gate having an input receiving said voltage mode clock, and a delay element receiving said voltage mode clock and outputting a delayed voltage mode clock to said NAND gate and to said NOR gate.

10. The very large scale integrated circuit of claim 9, wherein a first transistor receives the output of said NAND gate, said first transistor connected to $V_{dd}$ and to said interconnect.

11. The very large scale integrated circuit of claim 10, wherein a second transistor receives the output of said NOR gate, said second transistor connected to ground and to said interconnect.

12. The very large scale integrated circuit of claim 11, wherein said first current mode flip-flop includes:
 a first current mirror for receiving a voltage reference and for producing a first reference current in response to said voltage reference;
 a second current mirror for producing a second reference current;
 a current input for modifying said second reference current;
 a current comparator for producing a difference current between said first reference current and said modified second reference current;
 an inverting amplifier for converting said difference current into a logic level voltage;
 a pulse shaper receiving said logic level voltage and for applying a delayed version to said current comparator to thereby form a clock signal having a pulse duration;
 a register stage for receiving a data signal and said clock signal; and
 a storage cell for storing data when said clock signal occurs.

13. The very large scale integrated circuit of claim 12, wherein said voltage reference is produced by a current reference.

14. The very large scale integrated circuit of claim 12, wherein said voltage reference is externally applied.

15. The very large scale integrated circuit of claim 12, wherein said first current mirror is fabricated using CMOS technology.

16. The very large scale integrated circuit of claim 15, wherein said CMOS technology is 45 nm CMOS technology.

17. The very large scale integrated circuit of claim 12, wherein said first current mode flip-flop is part of an H-tree clock distribution network.

18. The very large scale integrated circuit of claim 17, wherein said first current mode flip-flop is part of a balanced H-tree clock distribution network.

* * * * *